(12) United States Patent  
Kihara

(10) Patent No.: US 6,856,190 B2  
(45) Date of Patent: Feb. 15, 2005

(54) LEAK CURRENT COMPENSATING DEVICE AND LEAK CURRENT COMPENSATING METHOD

(75) Inventor: Hideyuki Kihara, Zama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/698,845

(22) Filed: Oct. 30, 2003

(65) Prior Publication Data

US 2004/0130378 A1 Jul. 8, 2004

(30) Foreign Application Priority Data

Oct. 31, 2002 (JP) ........................................ 2002-317722

(51) Int. Cl.[7] ............................. G05F 1/10; G05F 3/02
(52) U.S. Cl. ...................................... 327/541; 327/544
(58) Field of Search ................................ 327/538, 540, 327/541, 543, 544; 323/280, 316

(56) References Cited

U.S. PATENT DOCUMENTS 3,823,332 A * 7/1974 Feryszka et al. ............ 323/313  
6,087,820 A * 7/2000 Houghton et al. .......... 323/315

FOREIGN PATENT DOCUMENTS

JP 63-150713 6/1988  
JP 63-255718 10/1988

* cited by examiner

Primary Examiner—Terry D. Cunningham  
Assistant Examiner—Quan Tra  
(74) Attorney, Agent, or Firm—Sheridan Ross PC

(57) ABSTRACT

To provide a leak current compensating device which ensures that the voltage of the output terminal is made to ground potential while minimizing sink current flowing from the output terminal, when the output transistor goes into the OFF state. The leak current compensating device according to the present invention comprises a first power source terminal; a second power source terminal having a lower potential than the first power source terminal; an output terminal; a first transistor which is connected at one end to the first power source terminal and which has a conductive state, in which the first transistor outputs a predetermined voltage or current from the other end to the output terminal, and a cut-off state; a second transistor of the same kind as the first transistor which is connected at one end to the first power source terminal and set in the cut-off state; a third transistor which is interposed at a path for the flow of a leak current output from the other end of the second transistor to the second power source terminal, and a control terminal of which is connected to the path; and a fourth transistor which constitutes a current mirror circuit with the third transistor and has a drive capacity to pass a current corresponding to the current flowing through the third transistor from the output terminal to the second power source terminal.

7 Claims, 5 Drawing Sheets

LEAK CURRENT COMPENSATING DEVICE AND LEAK CURRENT COMPENSATING METHOD

BACKGROUND OF THE INVENTION

The present invention relates to a leak current compensating device and leak current compensating method for a semiconductor device.

Various circuits have an output transistor switched between the ON or OFF state. Patent documents 1 and 2 describe a prior art constant voltage source circuit comprising the output transistor switched between the ON or OFF state. FIG. 5 is a diagram of the prior art constant voltage source circuit. FIG. 5 shows an operational amplifier 1, a reference voltage source 2 outputting a voltage VA, an output transistor 3 as PMOS transistor, an output terminal 4, a power source terminal 5 receiving a source voltage VDD, an NMOS transistor 6, a control terminal 7, and resistance elements 8, 9 and 16.

The operational amplifier 1 is connected to the reference voltage source 2 at inverting input terminal thereof and is connected to the gate of the PMOS transistor 3 at output terminal thereof. The source of the PMOS transistor 3 is connected to the power source terminal 5 and the drain of the PMOS transistor 3 is connected to the output terminal 4 and the resistance elements 8 and 16. The drain of the PMOS transistor 3 is grounded via a series circuit of the resistance elements 8 and 9. The node between the resistance elements 8 and 9 is connected to a noninverting input terminal of the operational amplifier 1. The drain voltage of the PMOS transistor 3 is divided by the resistance elements 8 and 9, and the divided voltage is applied to the noninverting input terminal of the operational amplifier 1.

The control terminal 7 is connected to the gate of the NMOS transistor 6 and a control terminal of the operational amplifier 1. The source of the NMOS transistor 6 is grounded and the drain of the NMOS transistor 6 is connected to the drain of the PMOS transistor 3 via the resistance element 16. Resistance values of the resistance element 8, 9 and 16 are referred to as R1, R2 and R3, respectively.

With the above-mentioned constitution, when a CONT signal (control signal) input to the control terminal 7 is at low level, the operational amplifier 1 goes into the operating (ON) state and the NMOS transistor 6 goes into the OFF state. Controlled by the operational amplifier 1, the PMOS transistor 3 outputs a voltage V=VA (1+R1/R2) from the output terminal 4.

When the CONT signal is at high level, the operational amplifier 1 goes into the non-operating (OFF) state and maintains the state in which the gate voltage of the PMOS transistor 3 is raised to VDD. The PMOS transistor 3 goes into the cut-off (OFF) state. At this time, since the CONT signal is at high level, the NMOS transistor 6 goes into the ON state and passes a current from the output terminal 4 through the resistance element 16. This makes the voltage V of the output terminal 4 to be ground potential.

As described above, the prior art constant voltage source circuit controls the voltage of the output terminal 4 in accordance with the CONT signal. In the case of normal operation (the CONT signal is at low level), the output terminal 4 outputs the voltage V=VA (1+R1/R2). In the case of output shutdown (the CONT signal is at high level), the voltage V of the output terminal 4 becomes ground potential (V=0).

SUMMARY OF THE INVENTION

In the prior art constant voltage source circuit shown in FIG. 5, when the CONT signal is at high level, the operational amplifier 1 goes into the OFF state and the PMOS transistor 3 goes into the cut-off state. The NMOS transistor 6 in the ON state makes the output terminal 4 to be at ground potential through the resistance element 16.

However, since the PMOS transistor 3 in the OFF state generates a leak current IL3, a potential difference of V3=IL3·R3 occurs across the resistance element 16, provided that the ON resistance of the NMOS transistor is ignored (The resistance value is set to R3. The resistance value R3 is much smaller than the resistance values R1 and R2 of the resistance elements 8 and 9, respectively), so that the potential of the output terminal 4 rises from ground potential to the voltage V3. The problem arises that as the temperature increases, the leak current IL3 increases and accordingly the potential of the output terminal 4 rises. By making impedance of the resistance element 16 smaller or removing the resistance element 16 to drive the output terminal 4 by the NMOS transistor 6 directly, the voltage V is decreased. In this case, however, the problem occurs that the output impedance of the output terminal 4 becomes too small, thereby allowing inflow of unnecessary current from outside.

Therefore, when the CONT signal is set at low level, the prior art constant voltage source circuit operates without problem in the normal output voltage condition. Meanwhile, when the CONT signal is set at high level to generate the OFF state, there arises the problems of raising potential of the output terminal due to leak current at high temperature and increasing sink current flowing from the circuit connected to the output terminal.

In order to solve the prior art problems mentioned above, the present invention intends to provide a leak current compensating device and leak current compensating method which ensure that the voltage of output terminal is made to ground potential while minimizing sink current flowing from the output terminal, when an output transistor switched to the ON or OFF state (ex. constant voltage source circuit. Other circuit such as a current source circuit may be adopted.) goes into OFF state.

To achieve this object, the present invention has the following constitution. The leak current compensating device from one aspect of the present invention comprises a first power source terminal; a second power source terminal having a lower potential than the above-mentioned first power source terminal; an output terminal; a first transistor which is connected at one end to the above-mentioned first power source terminal and which has a conductive state, in which the first transistor outputs a predetermined voltage or current from the other end to the above-mentioned output terminal, and a cut-off state; a second transistor of the same kind as the above-mentioned first transistor which is connected at one end to the above-mentioned first power source terminal and set in the cut-off state; a third transistor which is interposed at a path for the flow of a leak current output from the other end of the above-mentioned second transistor to the above-mentioned second power source terminal, and a control terminal of which is connected to the above-mentioned path; and a fourth transistor which constitutes a current mirror circuit with the above-mentioned third transistor and has a drive capacity to pass a current corresponding to the current flowing through the above-mentioned third transistor from the above-mentioned output terminal to the above-mentioned second power source terminal.

The above-mentioned leak current compensating device from another aspect of the present invention further comprises a fifth transistor which is interposed at a path for the flow of a leak current output from the other end of the above-mentioned second transistor to the above-mentioned second power source terminal, goes into the conductive state when the above-mentioned first transistor is in the cut-off state and goes into the cut-off state when the first transistor is in the conductive state; and a sixth transistor which is interposed at a path from the above-mentioned output terminal to the above-mentioned second power source terminal through the above-mentioned fourth transistor, goes into the conductive state when the above-mentioned first transistor is in the cut-off state and goes into the cut-off state when the first transistor is in the conductive state.

In the above-mentioned leak current compensating device from another aspect of the present invention, the current drive capacity of the above-mentioned fourth transistor is equal or more than the leak current of the above-mentioned first transistor.

In the above-mentioned leak current compensating device from another aspect of the present invention, the above-mentioned first transistor, the above-mentioned second transistor, the above-mentioned third transistor and the above-mentioned fourth transistor are MOS transistors or bipolar transistors.

In the above-mentioned leak current compensating device from another aspect of the present invention, the above-mentioned first transistor is a PMOS transistor which is connected to the above-mentioned first power source terminal at source thereof and outputs a predetermined voltage or current from drain thereof to the above-mentioned output terminal; an operational amplifier which has an inverting input terminal receiving a predetermined potential, a non-inverting input terminal receiving an output voltage output from the above-mentioned output terminal directly or receiving a voltage generated by dividing the above-mentioned output voltage with resistance elements, and an output terminal outputting a control signal for controlling the gate of the above-mentioned first transistor, and brings the above-mentioned first transistor into the cut-off state in a predetermined case is further comprised; the above-mentioned second transistor is a PMOS transistor which is connected to the above-mentioned first power source terminal at source and gate thereof and set in the cut-off state; and the above-mentioned third transistor and the above-mentioned fourth transistor are NMOS transistors which are connected to the above-mentioned second power source at each source, and the above-mentioned fourth transistor has a drive capacity to pass a current, which is predetermined times as large as the leak current of the above-mentioned second transistor, from the above-mentioned output terminal to the above-mentioned second power source terminal.

The leak current compensating method from another aspect of the present invention comprises a first step of outputting a predetermined voltage or current from one end of the above-mentioned first transistor, the other end of which is connected the above-mentioned first power source terminal; a second step of bringing the above-mentioned first transistor into the cut-off state; a third step of inputting a leak current output from a second transistor of the same kind as the above-mentioned first transistor, which is connected at one end to the above-mentioned first power source terminal and set in the cut-off state, to one end and a control terminal of a third transistor, and passing the current from the other end of the above-mentioned third transistor to the above-mentioned second power source terminal having a lower potential than the above-mentioned first power source terminal; and a fourth step of passing a current from one end of the above-mentioned first transistor to the above-mentioned second power source terminal through the above-mentioned fourth transistor which constitutes a current mirror circuit with the above-mentioned third transistor and has a drive capacity to pass a current corresponding to the current flowing through the above-mentioned third transistor.

In the above-mentioned leak current compensating method from another aspect of the present invention, in the above-mentioned second step, the above-mentioned fifth transistor which is interposed at a path for the flow of a leak current output from the other end of the above-mentioned second transistor to the above-mentioned second power source terminal and a sixth transistor which is interposed at a path from the other end of the above-mentioned first transistor to the above-mentioned second power source terminal through the above-mentioned fourth transistor are brought into the conductive state; and in the above-mentioned first step, the above-mentioned fifth transistor and the above-mentioned sixth transistor are brought into the cut-off state.

The present invention has the effect of achieving a leak current compensating device and a leak current compensating method which ensure that the voltage of the output terminal is made to ground potential even at higher-temperature atmosphere while minimizing sink current flowing from the output terminal when the output transistor in the ON state or the OFF state is turned OFF.

In the descriptions of the specification and claims, the term "leak current" generally means the current output from the transistor in the cut-off state. The leak current is not limited to the current output from the transistor in the cut-off state due to specific reasons. The leak current is typically a dark current of the transistor.

The novel features of the invention are set forth with particularity in the appended claims. The invention as to both structure and content, and other objects and features thereof will best be understood from the detailed description when considered in connection with the accompanying drawings.

Part or All of the drawings are drawn schematically for diagrammatic representation and it should be considered that they do not necessarily reflect relative size and position of components shown therein.

DETAILED DESCRIPTION OF THE INVENTION

Embodiments that specifically show the best mode for conducting the present invention will be described below with reference to figures.

<<First Embodiment>>

Figure 1:
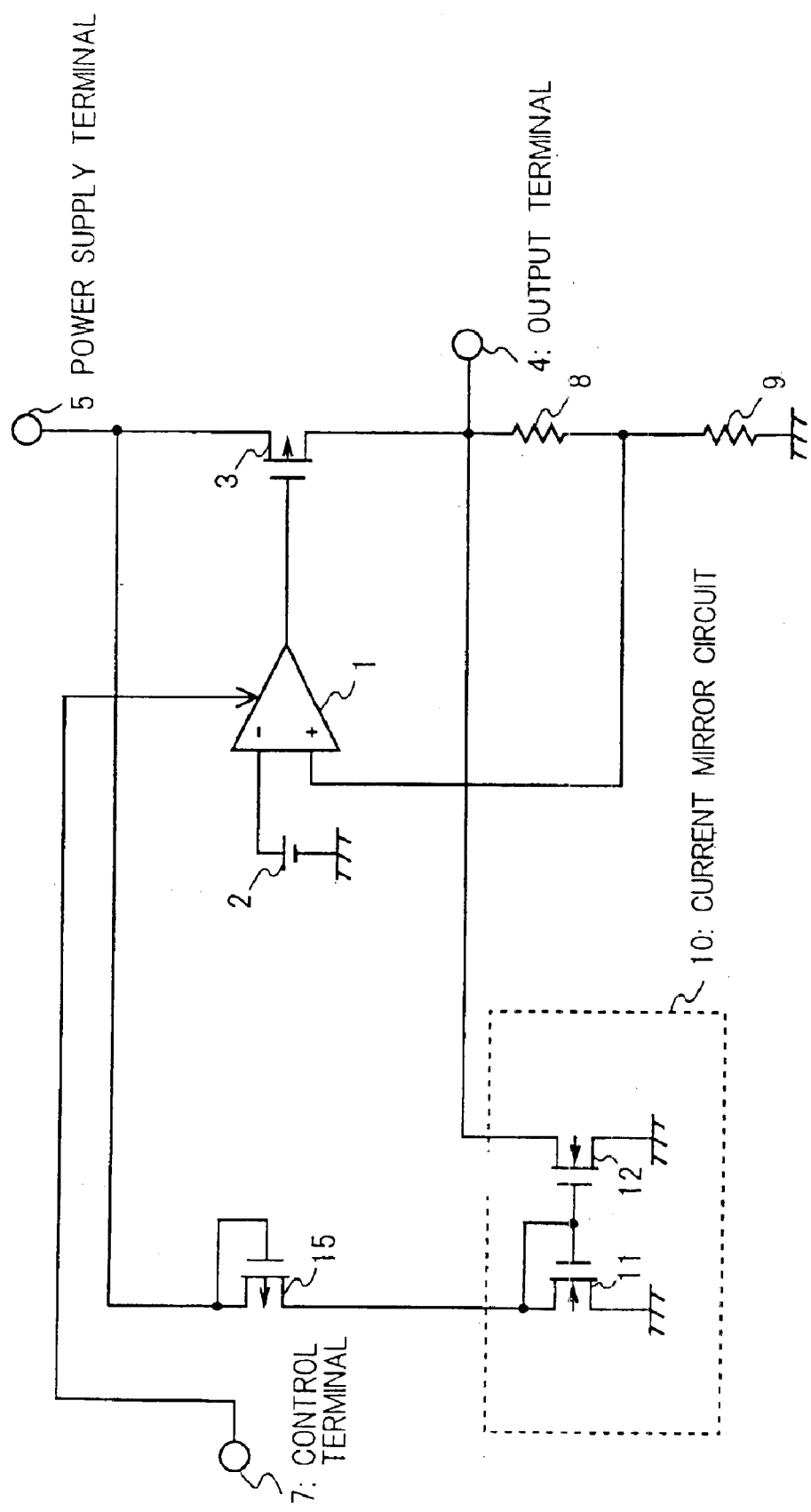
FIG. 1 is a circuit diagram of a leak current compensating device of a first embodiment according to the present invention.
Figure 5:
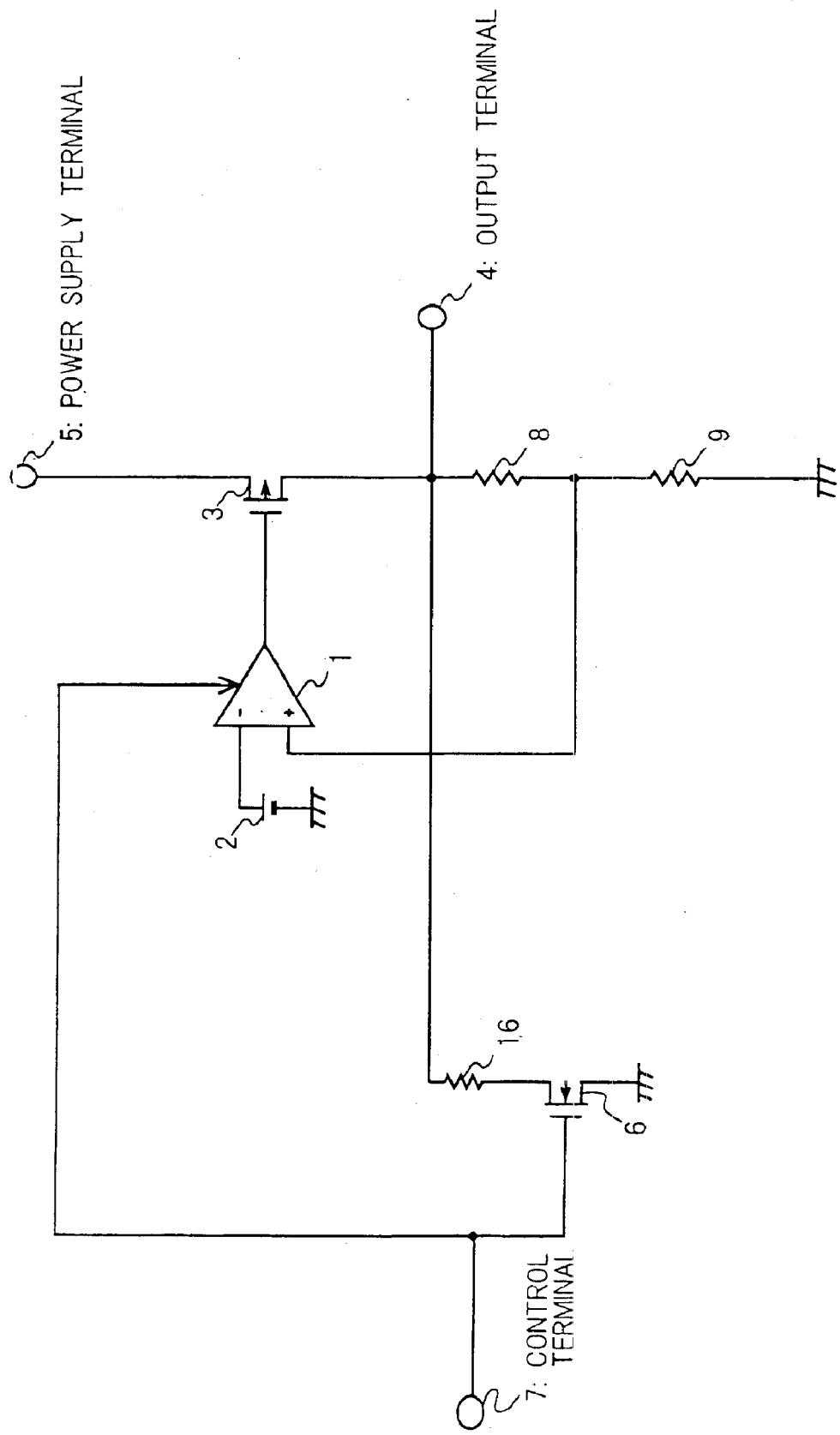
FIG. 5 is a circuit diagram of a prior art constant voltage source circuit.

Referring to FIG. 1, a leak current compensating device of a first embodiment according to the present invention will be described below. FIG. 1 is a circuit diagram of the leak current compensating device of the first embodiment according to the present invention. The leak current compensating device of the first embodiment serves as a constant voltage source in normal condition and is formed in a semiconductor device. FIG. 1 shows an operational amplifier 1, a reference voltage source 2 outputting a voltage VA, an output transistor 3 as PMOS transistor, an output terminal 4, a power source terminal (first power source terminal) 5 receiving a source voltage VDD, a control terminal 7, resistance elements 8 and 9, NMOS transistors 11 and 12, and a PMOS transistor 15. In FIG. 1, same reference numerals are assigned to the identical elements in FIG. 5. In this embodiment, a second power source terminal is a ground terminal (not shown).

The operational amplifier 1 is connected to the reference voltage source 2 at inverting input terminal thereof and is connected to the gate of the PMOS transistor 3 at output terminal thereof. The operational amplifier 1 outputs a control signal for controlling the gate of the PMOS transistor 3. The source of the PMOS transistor 3 is connected to the power source terminal 5 and the drain of the PMOS transistor 3 is connected to the output terminal 4, the resistance element 8 and the NMOS transistor 12. The drain of the PMOS transistor 3 is grounded via a series circuit of the resistance elements 8 and 9. The node between the resistance elements 8 and 9 is connected to a noninverting input terminal of the operational amplifier 1. The drain voltage of the PMOS transistor 3 is divided by the resistance elements 8 and 9, and the divided voltage is applied to the noninverting input terminal of the operational amplifier 1. The control terminal 7 is connected to a control input terminal of the operational amplifier 1.

The PMOS transistor 15, gate and source of which are connected to the power source terminal 5, is in the OFF state (same state as the state of PMOS transistor 3 in the case when PMOS transistor 3 is in the OFF state). The drain of the PMOS transistor 15 is connected to the gate and drain of the NMOS transistor 11 and the gate of the NMOS transistor 12 to output a leak current IL15. The sources of the NMOS transistors 11 and 12 are grounded. The drain of the NMOS transistor 12 is connected to the drain of the PMOS transistor 3 and the output terminal 4. The NMOS transistors 11 and 12 constitute a current mirror circuit 10. The NMOS transistor 12 as an output stage of the current mirror circuit 10 has a drive capacity to pass a current I12, which is predetermined times as large as the leak current IL15 of the PMOS transistor 15 flowing from the drain to the source of the NMOS transistor 11 (in the first embodiment, the value of "predetermined times" is 1 or more), from the output terminal 4 to the ground. The resistance values of the resistance elements 8 and 9 are defined as R1 and R2, respectively.

With the above-mentioned constitution, when a CONT signal (control signal) input to the control terminal 7 is at low level, the operational amplifier 1 goes into the operating (ON) state. Controlled by the operational amplifier 1, the PMOS transistor 3 outputs a voltage V=VA (1+R1/R2) from the output terminal 4.

When the CONT signal is at high level, the operational amplifier 1 goes into the non-operating (OFF) state and maintains the state in which the gate voltage of the PMOS transistor 3 is raised to VDD. The PMOS transistor 3 goes into the cut-off (OFF) state.

The leak current compensating device of the first embodiment according to the present invention controls voltage of the output terminal 4 by means of the CONT signal. The output terminal 4 outputs the voltage V=VA (1+R1/R2) in the case of normal operation (the CONT signal is at low level), while the voltage V of the output terminal 4 is made at ground potential (V=0) in the case of output shutdown (the CONT signal is at high level).

Irrespective of whether the PMOS transistor 3 is in the predetermined conductive state or cut-off state, the PMOS transistor 12 has a drive capacity to pass the current I12 corresponding to the leak current IL15 of the PMOS transistor 15 from the output terminal 4 to the ground. Since the current drive capacity I12 of the NMOS transistor 12 (i.e. the amount corresponding to the leak current IL15 of the PMOS transistor 15) is much smaller than the current output from the PMOS transistor 3 in the conductive state, the NMOS transistor 12 has no effect on output voltage of the PMOS transistor 3 in the conductive state.

The current drive capacity I12 of the NMOS transistor 12 is greater than the leak current IL3 of the PMOS transistor 3 by a predetermined amount. In the case that the PMOS transistor 3 is in the cut-off state, the NMOS transistor 12 pass the leak current IL3 of the PMOS transistor 3 to the ground. This allows the output terminal 4 to maintain at the ground potential (V=0).

Since the NMOS transistors 11 and 12 should only pass the leak current IL3 of the PMOS transistor 3, small-sized transistors as the NMOS transistors 11 and 12 are sufficient to carry out the function. In no case will the impedance of output terminal 4 become smaller than required impedance. Therefore, even when the constant voltage source circuit goes into the OFF state and the potential of the output terminal 4 becomes the ground potential, the sink current flowing from the output terminal 4 is minimized.

The amount of the leak current IL3 of the PMOS transistor 3 is very small in a low-temperature atmosphere and relatively greater value in a high-temperature atmosphere. Similarly, the current drive capacity of the NMOS transistor 12 is very small in a low-temperature atmosphere and relatively greater value in a high-temperature atmosphere. The NMOS transistor 12 thus enables the output terminal 4 to maintain at the ground potential (V=0) depending on change in environmental temperature, without receiving excessive current from the output terminal 4.

Operation of the leak current compensating device (leak current compensating method) of the first embodiment according to the present invention will be described. When the CONT signal is at low level, the PMOS transistor 3 goes into the conductive state and outputs the predetermined voltage V=VA (1+R1/R2) from drain thereof (first step). When the CONT signal is at high level, the PMOS transistor 3 goes into the cut-off state (second step). The leak current IL15 output from the PMOS transistor 15 in the cut-off state is input to the drain and gate of the NMOS transistor 11 and then passed from the source of the NMOS transistor 11 to the ground (third step). Through the NMOS transistor 12, which constitutes the current mirror circuit along with the NMOS transistor 11 and has a current drive capacity corresponding to the current flowing through the NMOS transistor 11, the current is passed from the drain of the PMOS transistor 3 to the ground (fourth step).

<<Second Embodiment>>

Figure 2:
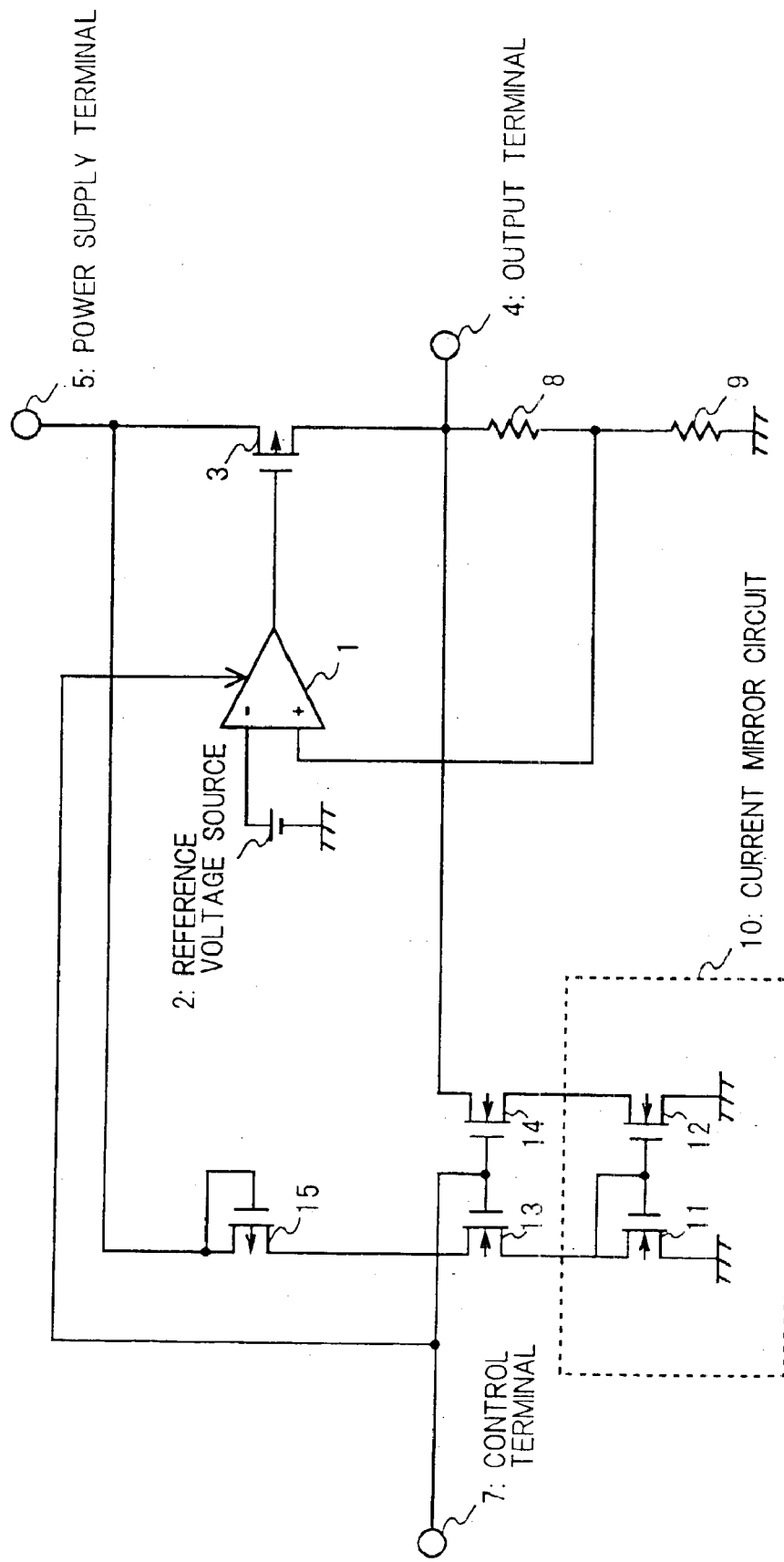
FIG. 2 is a circuit diagram of a leak current compensating device of a second embodiment according to the present invention.

Referring to FIG. 2, a leak current compensating device of a second embodiment according to the present invention will be described below. FIG. 2 is a circuit diagram of the leak current compensating device of the second embodiment according to the present invention. The leak current compensating device of the second embodiment serves as a constant voltage source in normal condition and is formed in a semiconductor device. FIG. 2 shows an operational amplifier 1, a reference voltage source 2 outputting a voltage VA, an output transistor 3 as PMOS transistor, an output terminal 4, a power source terminal (first power source terminal) 5 receiving a source voltage VDD, a control terminal 7, resistance elements 8 and 9, NMOS transistors 11, 12, 13 and 14 and a PMOS transistor 15. In FIG. 2, same reference numerals are assigned to the identical elements in FIG. 1. The leak current compensating device of the second embodiment is identical to that of the first embodiment except that the NMOS transistors 13 and 14 are added thereto. Descriptions of the same elements are omitted.

The leak current compensating device of the second embodiment further comprises the NMOS transistor 13 interposed between the drain of the PMOS transistor 15 and the drain of the NMOS transistor 11, and the NMOS transistor 14 interposed between the output terminal 4 (the drain of the PMOS transistor 3) and the drain of the NMOS transistor 12. A CONT signal is input to the gates of the NMOS transistors 13 and 14. The NMOS transistors 13 and 14 go into the conductive state when the PMOS transistor is in the cut-off state and go into the cut-off state when the PMOS transistor 3 is in the conductive state. The NMOS transistors 13 and 14 may be interposed between the source of the NMOS transistor 11 and the ground and between the source of the NMOS transistor 12 and the ground, respectively instead of the constitution in FIG. 2.

Operation of the leak current compensating device (leak current compensating method) of the second embodiment according to the present invention will be described. When the CONT signal is at low level (the PMOS transistor 3 is in the conductive state), the NMOS transistors 13 and 14 go into the cut-off state. Since the leak current of the NMOS transistor 14 is much smaller than the current drive capacity of the NMOS transistor 12, when the PMOS transistor 3 is in the conductive state, it can be prevented that current is fed from the PMOS transistor 3 to the NMOS transistor 12.

When the CONT signal is at high level (the PMOS transistor 3 is in the cut-off state), the NMOS transistors 13 and 14 go into the conductive state. The NMOS transistor 12 passes the leak current IL3 output from the PMOS transistor 3 to the ground through the NMOS transistor 14. The potential of the output terminal 4 is substantially maintained at ground potential. In the case that the PMOS transistor 3 is in the cut-off state, operation of the leak current compensating device of the second embodiment is same as that of the first embodiment.

<<Third Embodiment>>

Figure 3:
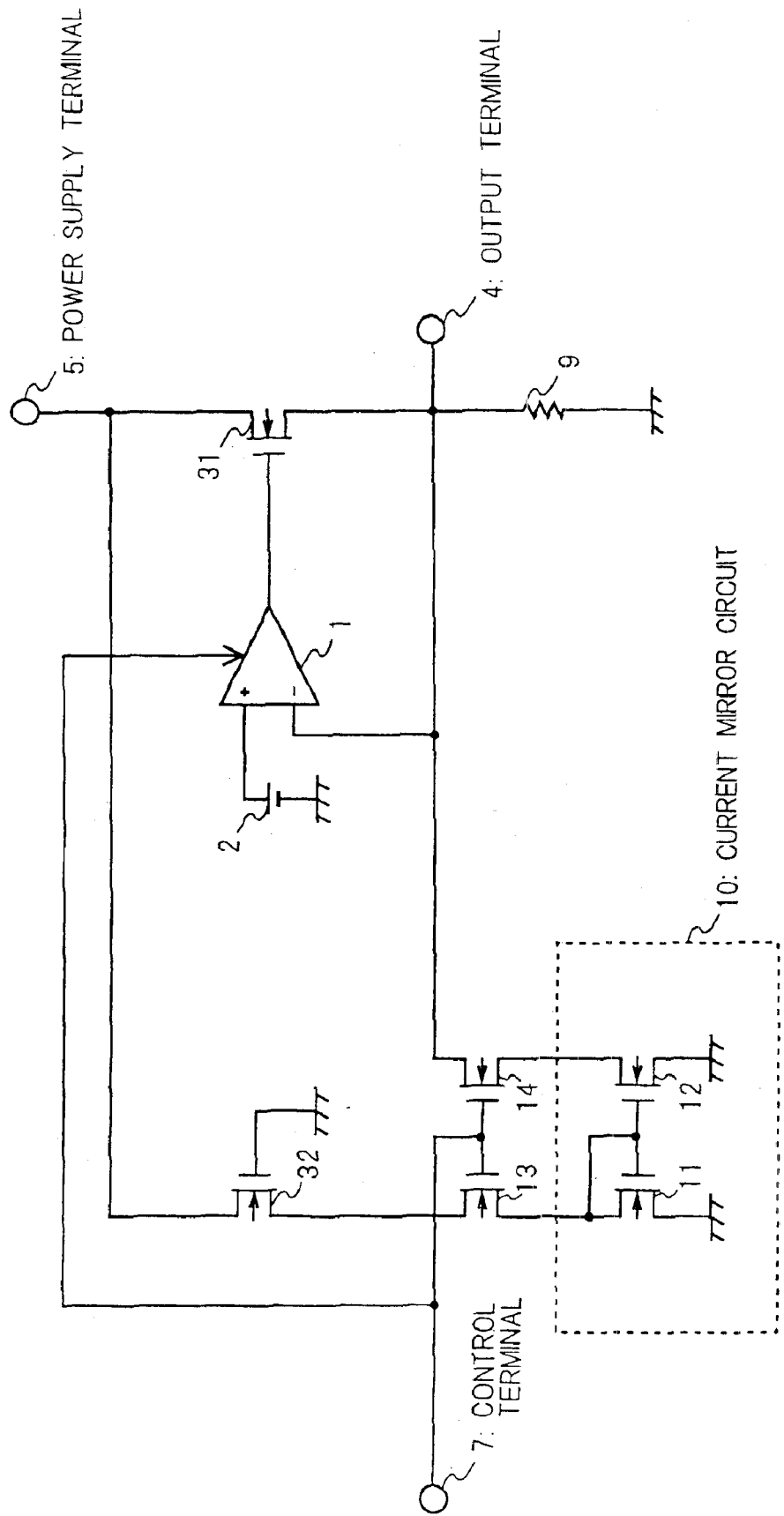
FIG. 3 is a circuit diagram of a leak current compensating device of a third embodiment according to the present invention.

Referring to FIG. 3, a leak current compensating device of a third embodiment according to the present invention will be described below. FIG. 3 is a circuit diagram of the leak current compensating device of the third embodiment according to the present invention. The leak current compensating device of the third embodiment serves as a constant voltage source in normal condition and is formed in a semiconductor device. FIG. 3 shows an operational amplifier 1, a reference voltage source 2 outputting a voltage VA, an output transistor 31 as NMOS transistor, an output terminal 4, a power source terminal (first power source terminal) 5 receiving a source voltage VDD, a control terminal 7, a resistance element 9, and NMOS transistors 11, 12, 13, 14 and 32. In FIG. 3, same reference numerals are assigned to the identical elements in FIG. 2. The leak current compensating device of the third embodiment is identical to that of the second embodiment except that the PMOS transistors 3 and 15 of the second embodiment are replaced with the NMOS transistors 31 and 32, an input signal of the operational amplifier is changed accordingly and the resistance 8 is removed. Descriptions of the same elements are omitted.

The operational amplifier 1 is connected to the reference voltage source 2 at a noninverting input terminal thereof and is connected to the gate of the NMOS transistor 31 at output terminal thereof. The operational amplifier 1 outputs a control signal for controlling the gate of the NMOS transistor 31. The drain of the NMOS transistor 31 is connected to the power source terminal 5 and the source of the NMOS transistor 31 is connected to the output terminal 4, the resistance element 9 and the NMOS transistor 14. The source of the NMOS transistor 31 is grounded via the resistance element 9. The source voltage of the NMOS transistor 31 is connected to an inverting input terminal of the operational amplifier 1. The source voltage of the NMOS transistor 31 is applied to the inverting input terminal of the operational amplifier 1. The control terminal 7 is connected to a control input terminal of the operational amplifier 1.

With the above-mentioned constitution, when a CONT signal (control signal) input to the control terminal 7 is at low level, the operational amplifier 1 goes into the operating (ON) state. Controlled by the operational amplifier 1, the NMOS transistor 31 outputs a voltage V=VA from the output terminal 4.

The NMOS transistor 32, the drain and the gate of which are connected to the power source terminal 5 and the ground, respectively, is in the OFF state (same state as the state of NMOS transistor 31 in the case when NMOS transistor 31 is in the OFF state). The source of the NMOS transistor 32 outputs a leak current IL32 to the input terminal of a current mirror circuit 10 through the NMOS transistor 13. NMOS transistor 12 as an output stage of the current mirror circuit 10 has a drive capacity to pass a current I12, which is predetermined times as large as the leak current IL32 of the NMOS transistor 32 (in the third embodiment, the value of "predetermined times" is 1 or more), from the output terminal 4 to the ground.

When the CONT signal is at low level (the NMOS transistor 31 is in the conductive state), the NMOS transistor 31 outputs the voltage V=VA from the output terminal 4. When the NMOS transistor 31 is in the conductive state, no current is passed from the NMOS transistor 31 to the NMOS transistor 12.

When the CONT signal is at high level (the NMOS transistor 31 is in the cut-off state), the NMOS transistors 13 and 14 go into the conductive state. The NMOS transistor 12 passes the leak current IL3 output from the NMOS transistor 31 to the ground through the NMOS transistor 14. The potential of the output terminal 4 is substantially maintained at ground potential.

<<Fourth Embodiment>>

Figure 4:
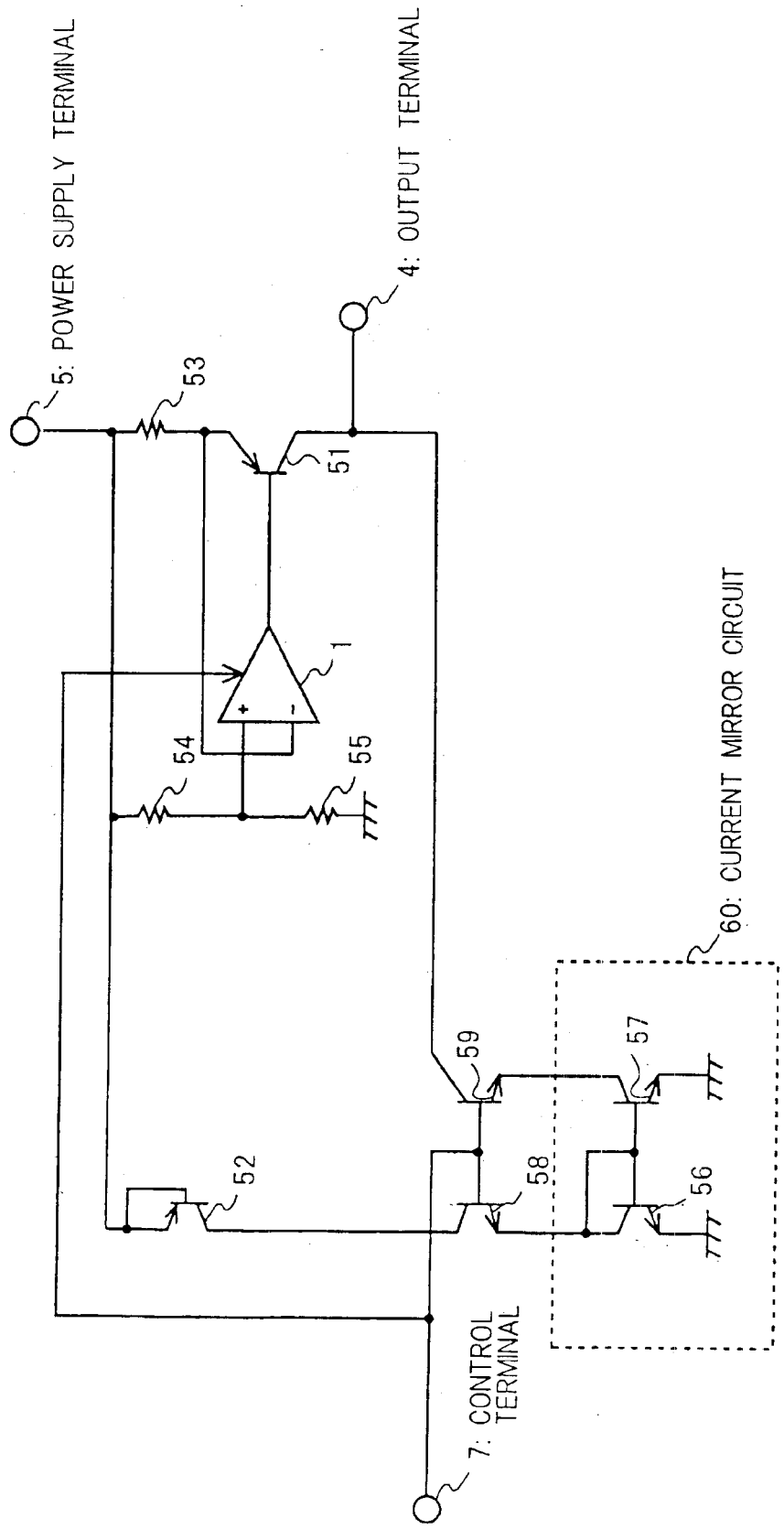
FIG. 4 is a circuit diagram of a leak current compensating device of a fourth embodiment according to the present invention.

Referring to FIG. 4, a leak current compensating device of a fourth embodiment according to the present invention will be described below. FIG. 4 is a circuit diagram of the leak current compensating device of the fourth embodiment according to the present invention. The leak current compensating device of the fourth embodiment serves as a constant voltage source in normal condition and is formed in a semiconductor device. FIG. 4 shows an operational amplifier 1, resistance elements 54 and 55 outputting a reference voltage VA from node therebetween, an output transistor 51 as PNP transistor, an output terminal 4, a power source terminal (first power source terminal) 5 receiving a source voltage VDD, a control terminal 7, a PNP transistor 52, a resistance element 53, and NPN transistors 56, 57, 58 and 59. All of the transistors in FIG. 4 are bipolar transistors.

In FIG. 4, same reference numerals are assigned to the identical elements in FIG. 2. The leak current compensating device of the fourth embodiment is identical to that of the second embodiment except that the constant voltage circuit (comprising the operational amplifier 1, the PMOS transistor 3 and so on) is replaced with the constant current source (comprising the operational amplifier 1, the PNP transistor 51 and so on), the PMOS transistor 51 is replaced with the PNP transistor 52 and the NMOS transistors 11 to 14 are replaced with the NPN transistors 56 to 59. Descriptions of the same elements are omitted.

The noninverting input terminal of the operational amplifier 1 is connected to a node between the resistance elements 54 and 55 (the voltage across the resistance element 54 is set to VA). The inverting input terminal and the output terminal of the operational amplifier 1 are connected to the emitter and the base of the PNP transistor 51, respectively. The resistance element 53 (resistance value R4) is connected to the point between the inverting input terminal of the operational amplifier 1 and an emitter of PNP transistor 51, and the power source terminal 5. The operational amplifier 1 controls the base of the PNP transistor 53 so as to hold the voltage across the resistance element 43 constant (to hold the current flowing through the resistance element 53 constant). The collector of the PNP transistor 51 is connected to the output terminal 4 and the PNP transistor 59. The control terminal 7 is connected to the control input terminal of the operational amplifier 1.

With the above-mentioned constitution, when a CONT signal (control signal) input to the control terminal 7 is at low level, the operational amplifier 1 goes into the operating (ON) state. Controlled by the operational amplifier 1, the NMOS transistor 31 outputs a constant current I=VA/R4 from the output terminal 4.

The NPN transistors 56 and 57 constitute a current mirror circuit 60.

The PNP transistor 52, the emitter and the base of which are connected to the power source terminal 5, is in the OFF state. The collector of the PNP transistor 52 outputs a leak current IL52 to the input terminal of the current mirror circuit 60 through the NPN transistor 58. NPN transistor 57 as an output stage of the current mirror circuit 60 has a drive capacity to pass a current I12, which is predetermined times as large as the leak current IL52 of the PNP transistor 52 (in the fourth embodiment, the value of "predetermined times" is 1 or more), from the output terminal 4 to the ground.

The NPN transistors 58 and 59 input the CONT signal to the bases.

When the CONT signal is at low level (the PNP transistor 51 is in the conductive state), the PNP transistor 51 outputs the current I=VA/R4 from the output terminal 4. The NPN transistors 58 and 59 go into the cut-off state. No current is passed from the collector of the PMOS transistor 51 to the NPN transistor 57.

When the CONT signal is at high level (the PNP transistor 51 is in the cut-off state), the NPN transistors 58 and 59 go into the conductive state. The NPN transistor 57 passes the leak current IL51 output from the PNP transistor 51 to the ground through the NPN transistor 59. The potential of the output terminal 4 is substantially maintained at ground potential (The output terminal 4 outputs no current).

In this embodiment, it is possible that the MOS transistor is replaced with the bipolar transistor and vice versa.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

The leak current compensating device and the leak current compensating method are useful, for example, in an electric power unit for various equipments such as personal computer.

What is claimed is:

1. A leak current compensating device comprising:

a first power source terminal;

a second power source terminal having a lower potential than said first power source terminal;

an output terminal;

a first transistor which is connected at one end to said first power source terminal and which has a conductive state, in which the first transistor outputs a predetermined voltage or current from the other end to said output terminal, and a cut-off state;

a second transistor of the same kind as said first transistor which is connected at one end to said first power source terminal and set in the cut-off state;

a third transistor which is interposed at a path for the flow of a leak current output from the other end of said second transistor to said second power source terminal, and a control terminal of which is connected to said path; and a fourth transistor which constitutes a current mirror circuit with said third transistor and has a drive capacity to pass a current corresponding to the current flowing through said third transistor from said output terminal to said second power source terminal.

2. A leak current compensating device in accordance with claim 1, further comprising:

a fifth transistor which is interposed at a path for the flow of a leak current output from the other end of said second transistor to said second power source terminal, goes into the conductive state when said first transistor is in the cut-off state and goes into the cut-off state when the first transistor is in the conductive state; and a sixth transistor which is interposed at a path from said output terminal to said second power source terminal through said fourth transistor, goes into the conductive state when said first transistor is in the cut-off state and goes into the cut-off state when the first transistor is in the conductive state.

3. A leak current compensating device in accordance with claim 1, wherein the current drive capacity of said fourth transistor is equal or more than the leak current of said first transistor.

4. A leak current compensating device in accordance with claim 1, wherein said first transistor, said second transistor, said third transistor and said fourth transistor are MOS transistors or bipolar transistors.

5. A leak current compensating device in accordance with claim 1, wherein said first transistor is a PMOS transistor which is connected to said first power source terminal at source thereof and outputs a predetermined voltage or current from drain thereof to said output terminal;

an operational amplifier which has an inverting input terminal receiving a predetermined potential, a noninverting input terminal receiving an output voltage output from said output terminal directly or receiving a voltage generated by dividing said output voltage with resistance elements, and an output terminal outputting a control signal for controlling the gate of said first transistor, and brings said first transistor into the cut-off state in a predetermined case is further comprised:

said second transistor is a PMOS transistor which is connected to said first power source terminal at source and gate thereof and set in the cut-off state; and said third transistor and said fourth transistor are NMOS transistors which are connected to said second power source at each source, and said fourth transistor has a drive capacity to pass a current, which is predetermined times as large as the leak current of said second transistor, from said output terminal to said second power source terminal.

6. A leak current compensating method comprising:

a first step of outputting a predetermined voltage or current from one end of a first transistor, the other end of which is connected a first power source terminal;

a second step of bringing said first transistor into the cut-off state;

a third step of inputting a leak current output from a second transistor of the same kind as said first transistor, which is connected at one end to said first power source terminal and set in the cut-off state, to one end and a control terminal of a third transistor, and passing the current from the other end of said third transistor to a second power source terminal having a lower potential than said first power source terminal; and a fourth step of passing a current from one end of said first transistor to said second power source terminal through said fourth transistor which constitutes a current mirror circuit with said third transistor and has a drive capacity to pass a current corresponding to the current flowing through said third transistor.

7. A leak current compensating method in accordance with claim 6, wherein in said second step, said fifth transistor which is interposed at a path for the flow of a leak current output from the other end of said second transistor to said second power source terminal and a sixth transistor which is interposed at a path from the other end of said first transistor to said second power source terminal through said fourth transistor are brought into the conductive state; and in said first step, said fifth transistor and said sixth transistor are brought into the cut-off state.

* * * * *